United States Patent
Westby et al.

(10) Patent No.: US 6,518,665 B1
(45) Date of Patent: Feb. 11, 2003

(54) ENHANCED UNDERFILL ADHESION

(75) Inventors: George Russell Westby, Owego, NY (US); Peter Borgesen, Binghamton, NY (US); Wilhelm Prinz von Hessen, Binghamton, NY (US)

(73) Assignee: Delaware Capital Formation, Inc., Wilmington, DE (US)

(*) Notice: Subject to any disclaimer, the term of this patent is extended or adjusted under 35 U.S.C. 154(b) by 0 days.

(21) Appl. No.: 09/397,697

(22) Filed: Sep. 16, 1999

Related U.S. Application Data

(63) Continuation of application No. 08/893,728, filed on Jul. 11, 1997, now abandoned.

(51) Int. Cl.[7] ............................................. H01L 23/48
(52) U.S. Cl. ...................... 257/738; 257/753; 257/774; 257/778; 257/779; 257/780; 228/180.22
(58) Field of Search ................................. 257/737, 738, 257/778, 779, 780, 781, 782, 734, 753, 773, 774, 777; 438/108, 612, 613; 228/180.21, 180.22

(56) References Cited

U.S. PATENT DOCUMENTS

| | | | | |
|---|---|---|---|---|
| 5,023,204 A | * | 6/1991 | Adachi et al. | 438/701 |
| 5,180,691 A | * | 1/1993 | Adachi et al. | 438/612 |
| 5,386,624 A | * | 2/1995 | George et al. | 29/832 |
| 5,943,597 A | * | 8/1999 | Kleffner et al. | 438/613 |
| 6,075,290 A | * | 6/2000 | Schaefer et al. | 257/737 |
| 6,323,542 B1 | * | 11/2001 | Hashimoto | 257/669 |

FOREIGN PATENT DOCUMENTS

| | | | |
|---|---|---|---|
| EP | 890981 | * | 1/1999 |
| JP | 64-1257 | * | 1/1989 |
| JP | 3-198342 | * | 8/1991 |
| JP | 5-291262 | * | 11/1993 |
| JP | 11-87404 | * | 3/1999 |

\* cited by examiner

*Primary Examiner*—Kamand Cuneo
*Assistant Examiner*—Alonzo Chambliss
(74) *Attorney, Agent, or Firm*—Burns, Doane, Swecker & Mathis, L.L.P.

(57) ABSTRACT

A flip chip having a chip passivation layer disposed on a metalization layer. Terminal vias are formed in the passivation layer exposing a portion of the metalization layer and terminal metalization is disposed on the metalization layer at the terminal vias. A stress reducing layer is disposed on the chip passivation layer with underfill apertures formed in the stress reducing layer so as to expose selected portions of the chip passivation layer, thereby enhancing the adhesion of an underfill material to the flip chip.

10 Claims, 2 Drawing Sheets

ENHANCED UNDERFILL ADHESION

This Application is a continuation of application Ser. No. 08/893,728, filed Jul. 11, 1997 now abandoned.

FIELD OF THE INVENTION

The present invention relates to flip chips, and more particularly to an improvement in the adhesion of the underfill material to the silicon chip in a flip chip assembly to a substrate.

BACKGROUND OF THE INVENTION

The conventional solution to this problem has been to underfill the chip with an adhesive which effectively bonds the chip to the substrate in order to reduce the load on the solder joints, The success of this method is limited, however, by the degree of adhesion of the underfill material to the chip passivation layer. As a result of thermal cycling, the underfill material tends to delaminate from the chip passivation layer, particularly at the chip edges and at the solder joints. This problem is exacerbated by flux residues and other contaminants, as well as by the nature of the passivation layer.

The conventional solution to this problem has been to underfill the chip with an adhesive which effectively bonds the chip to the substrate in order to reduce the load on the solder joints. The success of this method is limited, however, by the degree of adhesion of the underfill material to the chip passivation layer. As a result of thermal cycling, the underfill material tends to delaminate from the chip passivation, particularly at the chip edges and at the solder joints. This problem is exacerbated by flux residues and other contaminants, as well as by the nature of the passivation layer.

SUMMARY OF THE INVENTION

It is, therefore, an object of the present invention to provide improved mounting of a flip chip to a substrate, particularly when it will be subjected to thermal excursions.

It is another object of the present invention to provide improved adhesion of the underfill material to the silicon chip in a flip chip assembly.

The above and other objects are achieved in accordance with the present invention by a flip chip having a chip passivation layer disposed on a metalization layer. Terminal vias are formed in the passivation layer to expose a portion of the metalization layer with terminal metalization disposed on the metalization layer at the terminal vias. A stress reducing layer is disposed on the chip passivation layer with underfill apertures formed in the stress reducing layer so as to expose a portion of the chip passivation layer adjacent the terminal metalization. This allows the underfill to bond to the passivation layer proximate the solder joints, and substantially limits the shear stress along the passivation layer/underfill interface.

In another aspect of the present invention, the stress reducing layer terminates a distance from the edge of the chip, thereby exposing a portion of the chip passivation layer or silicon at the edge of the chip. This allows the underfill to bond to the passivation or metalization layer proximate the chip edge, and again substantially limits the shear stress along the chip edge underfill interface.

These and other objects, features and advantages of the present invention will be apparent and fully understood from the following detailed description of the preferred embodiments, taken in connection with the appended drawings.

BRIEF DESCRIPTION OF THE DRAWINGS

The present invention can be better understood when considered with the following drawings in which like reference numerals refer to like elements.

DETAILED DESCRIPTION OF THE INVENTION

Figure 1:
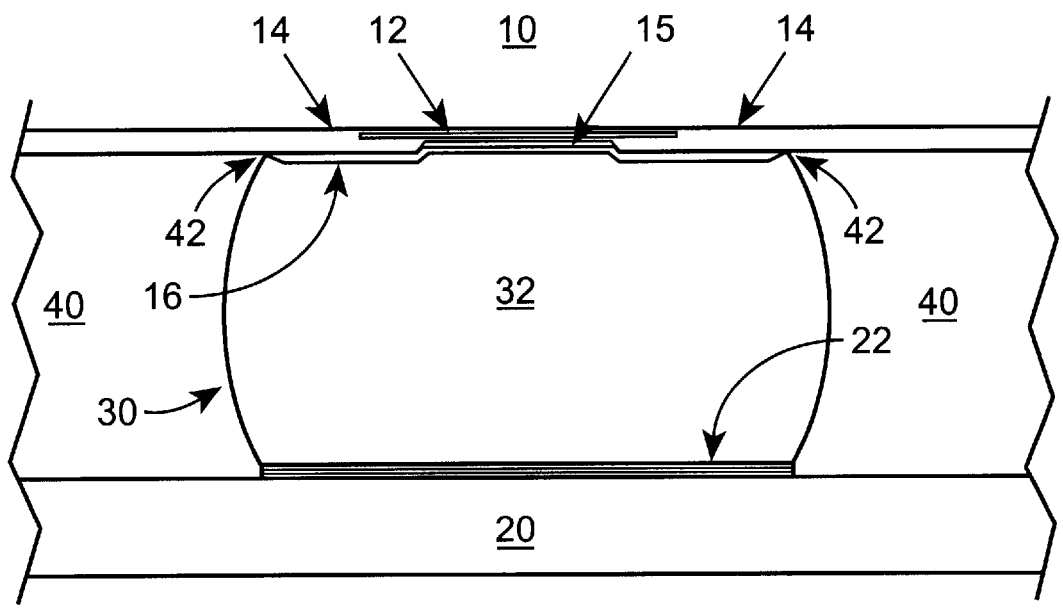
FIG. 1 is a partial cross-sectional view of a prior art flip chip mounted to a substrate.

Referring to FIG. 1, a prior art flip chip 10 is shown mounted to a substrate 20 by solder 32. The flip chip 10 includes a final metalization layer 12 with a glass passivation layer 14 formed over it. The chip passivation layer 14 may alternatively be formed of nitride, oxide, polyimide or other materials well known in the art. The chip passivation layer is typically about 1 $\mu$m thick, although thickness and composition are a matter of design choice.

Terminal vias 15 (one of which is shown) are formed in the passivation layer 14 to expose selected terminal portions of the final metalization layer 12 and provide connection points for the terminal metalization 16. In FIG. 1 the terminal metalization 16 is often referred to as an under bump metalization (UBM) layer. It should be apparent, however, that other terminal metalization technologies may be used, in part, depending on the connection method and material selected.

In FIG. 1, solder 32 is used to mount the chip 10 to the substrate 20. The solder 32 is formed between the terminal metalization 16 and a corresponding contact pad metalization 22 on the substrate 20 to secure the flip chip 10 to the substrate 20 and provide the electrical connection to the next level assembly. In one embodiment, the solder 32 is applied first to the terminal metalization 16 of the chip 10 in the form of miniature balls and then reflowed to form the connection to the contact pads 22 of the substrate 20 as is well known in the art. It should be understood, however, that other methods of applying the solder 32, to either the chip 10 or the substrate 20, may be employed. Further, other methods of connecting and securing the chip 10 to the substrate 20, for example conductive polymers, may also be used.

An underfill epoxy 40 is applied in the space between the chip 10 and the substrate 20. The underfill 40 adheres the entire chip 10 to the substrate 20, thereby reducing the stress on the solder joints 30 during thermal excursions. As indicated, however, the underfill material may delaminate from the chip passivation layer 14, reducing the benefits achieved by the underfill 40.

The shear stresses experienced during thermal excursions particularly favor initiation of delamination at the point 42 right next to the solder joint 30. Once such a crack is initiated, a singularity in the shear stress at that location promotes rapid growth. Eventually, the delamination progresses to such a degree that the underfill 40 is no longer able to effectively control the stress on the solder joints 30 and fatigue, and eventually failure, of the joints 30 follow.

Figure 2:
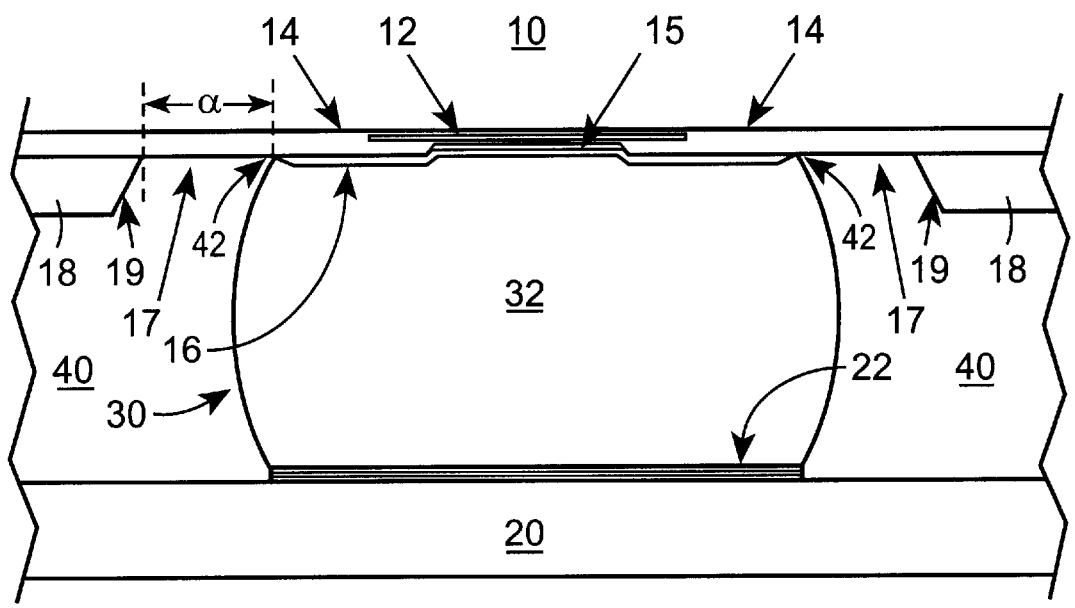
FIG. 2 is a partial cross-sectional view of a flip chip mounted to a substrate in accordance with the present invention.

In accordance with the present invention, illustrated in FIG. 2, an additional stress reducing layer 18 is applied to the bottom of the flip chip 10 over the passivation layer 14. In one embodiment, this stress reducing layer 18 is formed of polyimide and is approximately 4–5 μm thick. However, other thicknesses or materials known in the art, such as glass, nitride and oxide may also be used.

Underfill apertures 17 are formed in the stress reducing layer adjacent the terminal metalization 16 (and consequently the solder joints 30) thereby exposing a portion of the passivation layer 14 proximate the terminal metalization 16. The distance a between the terminal metalization 16 (solder joint 30) and the edge 19 of the stress reducing layer 18 may range between approximately 5 and 30 μm, and is preferably approximately 10 μm.

The underfill apertures 17 leave exposed a portion of the passivation layer 14 adjacent the terminal metalization 16, preferably forming a complete aperture around the terminal metalization 16. This allows the underfill 40 to bond to the passivation layer 14 proximate the terminal metalization 16 (and solder joints 30), and substantially limits the shear stress along the passivation layer/underfill interface. In effect, it is believed that the shear stress is replaced by a tensile stress within the underfill 40 between the stress reducing layer 18 and the solder joint 30, and a combined shear and tension stress in the underfill 40 at the tapered edge 19 of the stress reducing layer 18. This has been shown through testing to significantly reduce the crack initiating shear stress at the point 42 right next to the solder joint 30 during thermal excursions. It is also believed that any contaminants contained near the solder joint 30 are contained by the underfill aperture 17, preventing their spread to the surface of the stress reducing layer 18 and the resulting possibility of delamination.

In the illustrated embodiment, the underfill apertures 17 are formed by a lithographic process, however, other methods known in the art may be used. Likewise, although the stress reducing layer 18 of the illustrated embodiment has tapered edges 19 forming underfill apertures 17 around the terminal metalization, other configurations, such as a straight wall opening, may also be employed.

Figure 3:
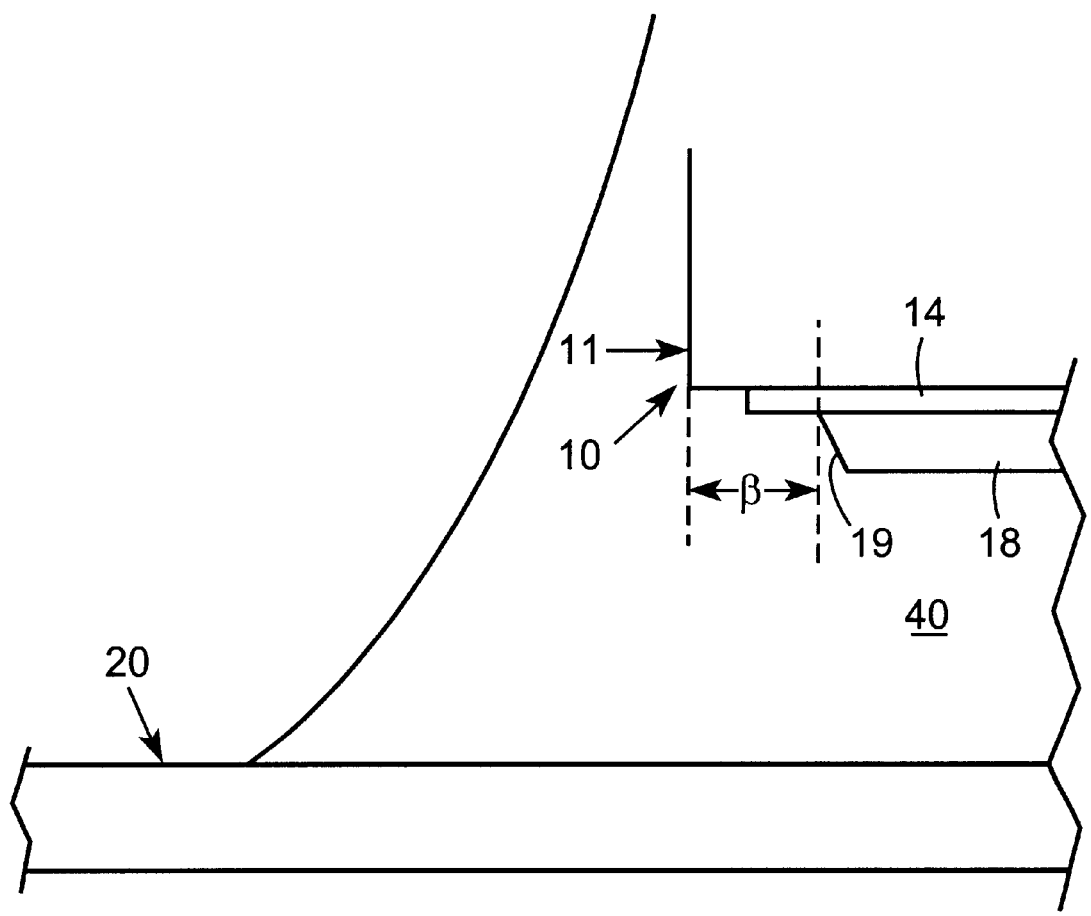
FIG. 3 is a partial cross-sectional view of the edge of a flip chip mounted to a substrate in accordance with the present invention.

In another aspect of the present invention, illustrated in FIG. 3, the stress reducing layer 18, as described with reference to FIG. 2, terminates a distance β from the edge 11 of the chip 10, thereby exposing a portion of the chip passivation layer or silicon 14 or 10 at the edge 11 of the chip 10. As in the case of the underfill apertures 17 previously described, this allows the underfill 40 to bond to the passivation layer or silicon 14 or 10 proximate the chip edge 11, and substantially limits the shear stress along the passivation layer/underfill interface. The distance β may range between approximately 5 and 30 μm, and is preferably approximately 10 μm. Again, however, the exact configuration of the stress reducing layer 18 may vary depending, in part, on the properties of the underfill material selected.

The present invention has been described in terms of the preferred embodiments of the invention, which are presented for purposes of illustration and not of limitation. It will be appreciated that modifications, variations and other features within the scope of the invention, given the benefit of the disclosure, will occur to one of ordinary skill in the art. For example, although described in the context of mounting a chip to a substrate, the present invention is equally applicable to other mountings of flip chips to the next level assembly, such as the mounting of a flip chip to form a packaged component. Likewise, other terminal metalization configurations may be used and still practice the present invention. The exact configuration of the stress reducing layer 18 (e.g., thickness, composition, shape of edge 19 and distance α from the terminal metalization 16 and distance β from the chip edge) may be varied and depends, in part, on the properties of the underfill material selected.

What is claimed is:

1. A flip chip comprising:
   a metalization layer;
   a chip passivation layer disposed on said metalization layer, said chip passivation layer having at least one terminal via exposing at least a portion of said metalization layer,
   a terminal metalization disposed on said metalization layer at said at least one terminal via; and
   a stress reducing layer disposed on said chip passivation layer, said stress reducing layer having an underfill aperture exposing a portion of said chip passivation layer adjacent said terminal metalization such that the adhesion of an underfill material to said flip chip is enhanced.

2. The flip chip of claim 1 wherein said stress reducing layer comprises polyimide.

3. The flip chip of claim 1 wherein said underfill aperture exposes a continuous section of said chip passivation layer around said terminal metalization.

4. The flip chip of claim 1 wherein stress reducing layer has a tapered edge at said underfill aperture.

5. The flip chip of claim 1, wherein the underfill material is an epoxy.

6. The flip chip of claim 1, wherein the underfill aperture has an opening that is larger than the terminal metalization.

7. A flip chip comprising:
   a metalization layer;
   a chip passivation layer disposed on said metalization layer, said chip passivation layer having at least one terminal via exposing at least a portion of said metalization layer;
   a terminal metalization disposed on said metalization layer at said at least one terminal via;
   a stress reducing layer disposed on said chip passivation layer, said stress reducing layer having an underfill aperture exposing a portion of said chip passivation layer adjacent said terminal metalization such that the adhesion of an underfill material to said flip chip is enhanced; and
   wherein said stress reducing layer is at least 4 μm thick.

8. The flip chip of claim 7, wherein the underfill aperture has an opening that is larger than the terminal metalization.

9. A flip chip comprising:
   a metalization layer;
   a chip passivation layer disposed on said metalization layer, said chip passivation layer having at least one terminal via exposing at least a portion of said metalization layer;
   a terminal metalization disposed on said metalization layer at said at least one terminal via;
   a stress reducing layer disposed on said chip passivation layer, said stress reducing layer having an underfill aperture exposing a portion of said chip passivation layer adjacent said terminal metalization such that the adhesion of an underfill material to said flip chip is enhanced; and
   wherein said stress reducing layer is approximately 5–30 μm from said terminal metalization.

10. The flip chip of claim 9, wherein the underfill aperture has an opening that is larger than the terminal metalization.

* * * * *